(12) United States Patent
Ju

(10) Patent No.: US 7,514,799 B2
(45) Date of Patent: Apr. 7, 2009

(54) CONNECTING STRUCTURE USED IN A CHIP MODULE

(75) Inventor: Ted Ju, Keelung (TW)

(73) Assignee: Lotes Co., Ltd., Keelung (TW)

( * ) Notice: Subject to any disclaimer, the term of this patent is extended or adjusted under 35 U.S.C. 154(b) by 139 days.

(21) Appl. No.: 11/492,877

(22) Filed: Jul. 26, 2006

(65) Prior Publication Data
US 2008/0023849 A1 Jan. 31, 2008

(51) Int. Cl.
*H01L 23/48* (2006.01)
*H01L 29/40* (2006.01)
(52) U.S. Cl. .................................. 257/781; 257/780
(58) Field of Classification Search ......... 257/779–781, 257/738, 772
See application file for complete search history.

(56) References Cited

U.S. PATENT DOCUMENTS 7,166,920 B2 * 1/2007 Saito et al. ................. 257/738

OTHER PUBLICATIONS

Charles Harper, Electronic Packaging and Interconnection Handbook, 2000, McGraw-Hill, p. 4.12.*

* cited by examiner

*Primary Examiner*—Monica Lewis
(74) *Attorney, Agent, or Firm*—Rosenberg, Klein & Lee

(57) ABSTRACT

An improved chip module is described. The improved chip is comprised of a loading board for connecting with an external electronic component, a plurality of electrical conductors electrically disposed on the loading board. Each electrical conductor has an elastic body and a metal layer disposed thereon. The chip module connects with the external PCB directly. The electrical connector does not need to be disposed between the chip module and the external PCB, thereby reducing the manufacturing cost of the chip module.

6 Claims, 3 Drawing Sheets

CONNECTING STRUCTURE USED IN A CHIP MODULE

BACKGROUND OF THE INVENTION

1. Field of the Invention

The present invention relates to the structure of a chip module, and particularly relates to the chip module that can connect to an external PCB directly and makes unnecessary the disposal of an electrical connector between the chip module and external PCB. Furthermore, the chip module also reduces the manufacturing cost of the chip module.

2. Description of Related Art

At present, chip modules are comprised of a chip, a heat sink disposed on the chip, and a loading board disposed on the bottom of the chip. A conductive flake is further disposed on the loading board. For connecting the chip module with the external PCB, an electrical connector must be disposed between the chip and the external PCB. One end of the electrical connector connects to the external PCB, and the other end of the electrical connector connects to the conductive flake of the chip module to achieve conductance between the chip module and the external PCB.

However, the production costs of the electrical connector for connecting the chip module with the external PCB are high and the manufacturing process is complex.

Therefore, it is necessary to design a type of chip module for overcoming the above mentioned defects.

SUMMARY OF THE INVENTION

The primary object of the present invention is to provide a chip module for reducing the production costs of the chip module.

For achieving the above object, the present invention provides an improved chip module, which comprises a loading board for connecting with an external electronic component, a plurality of electrical conductors electrically disposed on the loading board. Each electrical conductor has an elastic body and a metal layer disposed thereon.

Compared with existing techniques, the chip module of the present invention provides a loading board connected with an external electrical component. The loading board comprises an elastic body, a metal layer disposed thereon and an electrical conductor disposed on the metal layer. Through the above features, the chip module can connect to an external PCB directly. The chip module does not need to have the electrical connector disposed between the chip module and the external PCB, so the chip module reduces the cost of manufacture.

For achieving the object stated above, it is to be understood that both the foregoing general description and the following detailed description are exemplary. Other advantages and features of the invention will be apparent from the following description, drawings and claims.

BRIEF DESCRIPTION OF THE DRAWINGS

The above and further advantages of this invention may be better understood by referring to the following description, taken in conjunction with the accompanying drawings, in which.

The drawings will be described further in connection with the following detailed description of the invention.

DETAILED DESCRIPTION OF PREFERRED EMBODIMENTS

Figure 1:
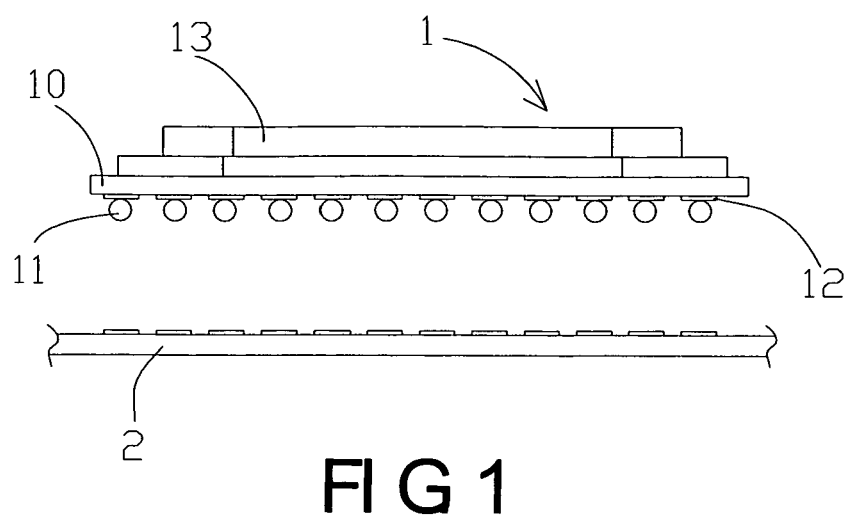
FIG. 1 is an exploded schematic view of the present invention chip module and the external PCB.
Figure 2:
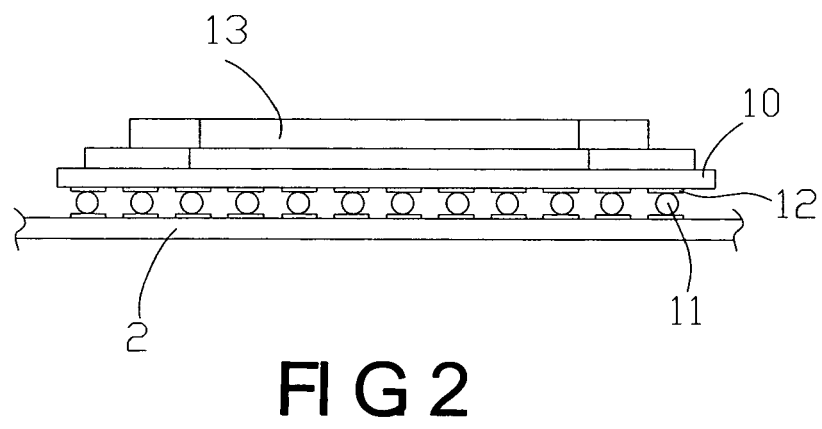
FIG. 2 is an assembled schematic view of the chip module and the external PCB of FIG. 1.
Figure 3:
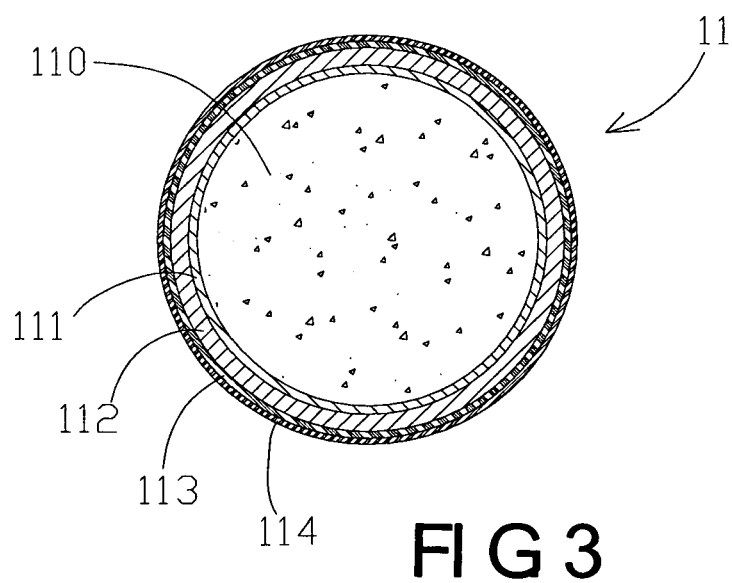
FIG. 3 is a cross-sectional and enlarged view of the electrical conductors of FIG. 1.

Referring to FIGS. 1-3, a chip module 1 comprises a loading board 10 for connecting with an external electronic component (such as a PCB 2). The loading board 10 has a plurality of conductive flakes 12 and a plurality of electrical conductors 11 electrically connected to conductive flakes 12. The chip module 1 furthermore has a chip (not shown) disposed on the loading board 10 and a heat conductor 13 disposed on the chip.

The electrical conductors 11 are approximately spherical (they can also be other shapes, such as ellipsoid) and have an elastic body 110 and a multi-storied metal layer disposed on an outside of the elastic body 110. The elastic body 110 is a non-conductive material, wherein the multi-storied metal layer includes a first metal layer 111 disposed on an outside of the elastic body 110 by physical platting (such as vacuum vaporization or vacuum splashing) and a second metal layer 112 is disposed on an outside of the first metal layer 111 by electroplating.

The first metal layer 111 and the second metal layer 112 are copper. The second metal layer 112 exists to thicken the first metal layer 111. The second metal layer 112 is thicker than the first metal layer 111. Moreover, a nickel layer 113 is platted on an outside of the second metal layer 112, and an outer metal layer 114 is platted on an outside of the nickel layer 113. The outer metal layer 114 is gold. The nickel layer 113 can be used to enhance the wear-resistance and the corrosion-resistance of the electrical conductor 11. The outer metal layer 114 enhances the electric conductivity of the electrical conductor 11 and reduces the impedance of electrical conductor 11.

Figure 4:
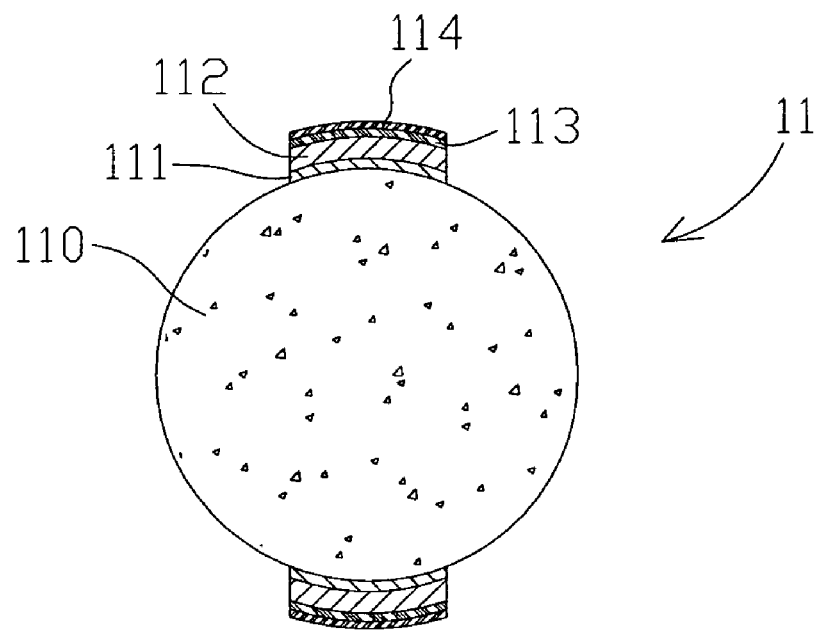
FIG. 4 is a cross-sectional and enlarged view of another embodiment of the electrical conductors of FIG. 1.

To maintain the elasticity of the electrical conductor 11, each metal layer can be platted on a part of the outside surface of the elastic body 110 (as shown in FIG. 4, the metal layer of the outside elastic body is ring-like) so that a continuous conductive path is formed. Furthermore, for platting the first metal layer 111 on the elastic body 110 easily, a medium layer (not shown) can be added on the outside surface of the elastic body 110 before platting the first metal layer 111 on the outside surface of the elastic body 110, so as to enhance the adhesive force of the first metal layer 111.

The electrical conductor 11 can be directly welded on the conductive flakes 12, or the electrical conductor 11 can adhere on the conductive flakes 12 via a conductive adhesive (not shown). A positioner (not shown) can be set on the PCB 2 to position the chip module 1 allowing the chip module 1 to connect to the PCB 2 directly. Therefore, the electrical connector can not be set between the chip module 1 and the PCB 2, thereby reducing manufacture costs.

Moreover, the chip module 1 can be connected with the electrical connector (not shown), so that the electrical connector connects with the PCB 2 to achieve the electrical connection between the chip module 1 and the PCB 2.

Figure 5:
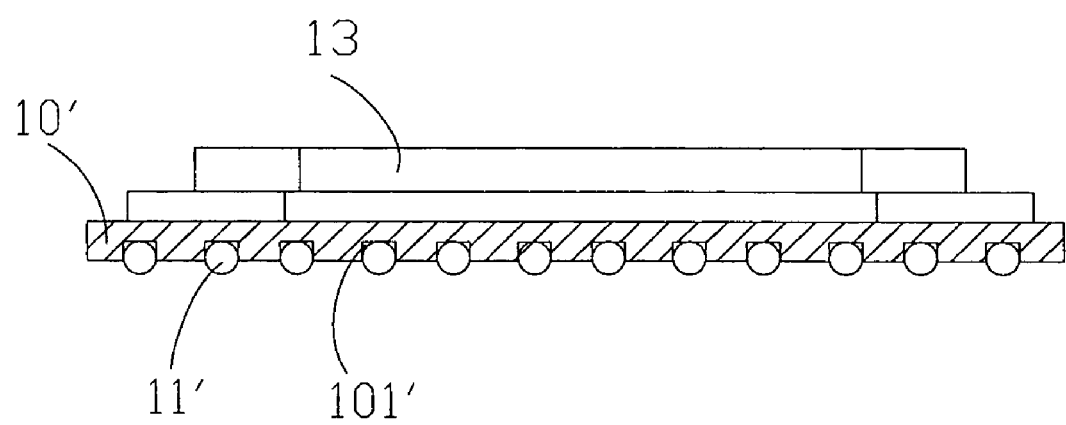
FIG. 5 is a partial cross-sectional view of the second embodiment of the chip module of the present invention.
Figure 6:
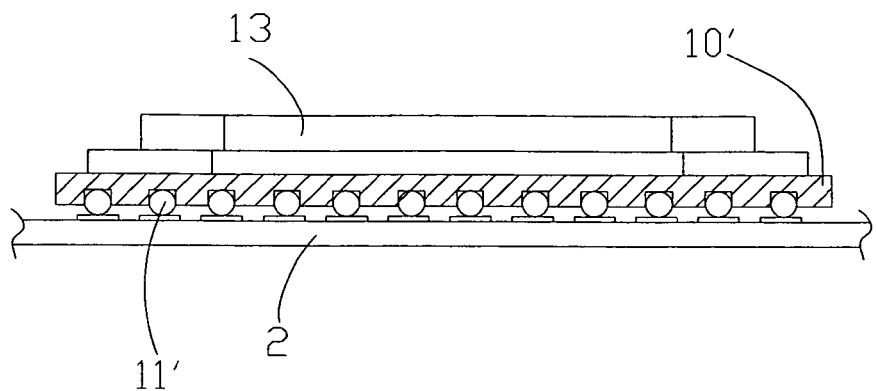
FIG. 6 is an assembled schematic view of the chip module and the external PCB of FIG. 5.

Referring to FIG. 5 and FIG. 6, schematic views of the second embodiment of the present invention are shown. The difference between the second embodiment and the first embodiment is that the bottom of the loading board 10' has a plurality of concave troughs 101' receiving electrical conductors 11' respectively. More than half of each electrical conductor 11' is received in each concave trough 101' for steadily connecting with the loading board 10'. Moreover, each metal layer of the electrical conductor 11' can be patted on a part of an outside surface of the elastic body 110 (shown in FIG. 3).

The second embodiment achieves the same object as the first embodiment.

Figure 7:
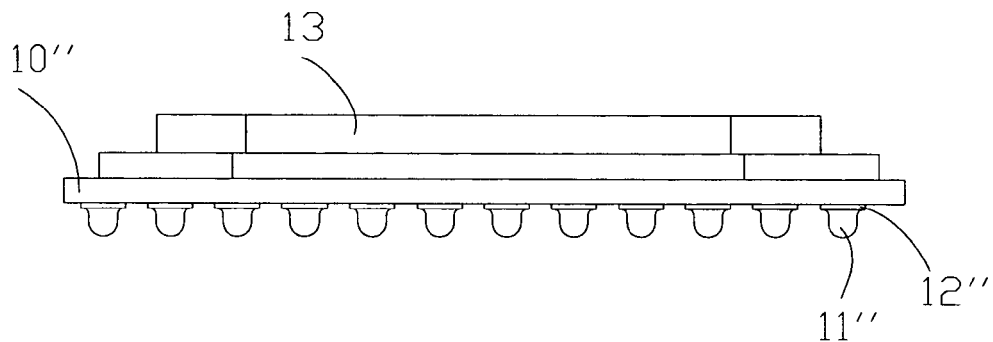
FIG. 7 is a schematic view of the third embodiment of the chip module of the present invention.

Referring to FIG. 7, a schematic view of the third embodiment of the present invention is shown. The difference between the third embodiment and the first embodiment is that the elastic body 110 (shown in FIG. 3) of the electrical conductor 11" connects firstly on the conductive flake 12" of the loading board 10". Next, each metal layer is platted (the same as was performed in the first embodiment. Moreover, each metal layer of the electrical conductor 11" can be patted on a part of the outside surface of the elastic body 110 (shown in FIG. 3).

The third embodiment achieves the same object as the first embodiment.

Figure 8:
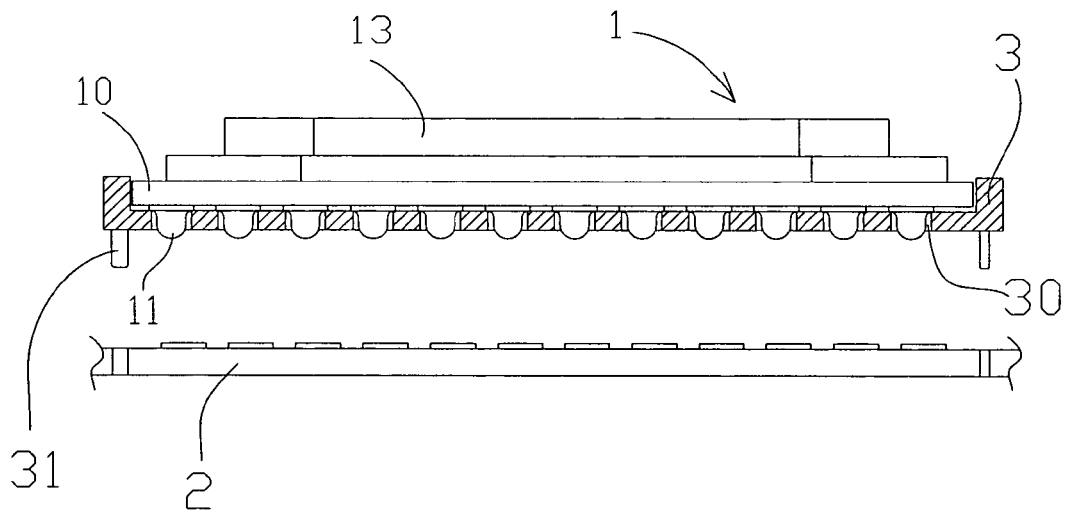
FIG. 8 is a schematic view of the fourth embodiment of the chip module of the present invention.

Referring to FIG. 8, a schematic view of the fourth embodiment of the present invention is shown. The structure of the chip module in the fourth embodiment is the same as the third embodiment (or the same as the chip module in the first embodiment). Moreover, a positioning mechanism 3 is disposed between the chip module 1 and the external PCB 2. The positioning mechanism 3 has a plurality of holes 30 correspondingly receiving the electrical conductor 11. The electrical conductor 11 connects the external PCB 2 through the positioning mechanism 3. The positioning mechanism 3 also has a positioning column 31 for positioning the external PCB 2.

Although the present invention has been described with reference to the preferred embodiments thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A connecting structure used in a chip module, comprising:
    a loading board for connecting with an external electronic component; and
    a plurality of electrical conductors electrically disposed on the loading board, wherein each electrical conductor has an elastic body and a metal layer disposed thereon
    wherein each electrical conductor has an elastic body, a first metal layer comprising copper located directly on the elastic body, a second metal layer comprising copper located directly on the first metal layer, a third metal layer comprising nickel located directly on the second metal layer, and an outer metal layer comprising gold located directly on the third metal layer.

2. The connecting structure used in a chip module as claimed in claim 1, wherein the loading board has a plurality of conductive flakes, and each electrical conductor connects with each conductive flake directly.

3. The connecting structure used in a chip module as claimed in claim 2, wherein the electrical conductor is welded to the conductive flake.

4. The improved chip module as claimed in claim 1, wherein the loading board has a plurality of concave troughs for correspondingly receiving the electrical conductors.

5. The improved chip module as claimed in claim 1, further comprising a positioning mechanism disposed in a bottom thereof, wherein the electrical conductors connect with the external electronic component through the positioning mechanism.

6. The connecting structure used in a chip module as claimed in claim 1, wherein the first metal layer is disposed on a part of an outside surface of the elastic body for forming a continuous conductive path.

* * * * *